United States Patent
Shieh et al.

(10) Patent No.: US 10,672,656 B2
(45) Date of Patent: Jun. 2, 2020

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventors: Ming-Feng Shieh, Yongkang (TW); Hung-Chang Hsieh, Hsin-Chu (TW); Wen-Hung Tseng, Luodong Township (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/875,535

(22) Filed: Oct. 5, 2015

(65) Prior Publication Data

US 2016/0027692 A1    Jan. 28, 2016

Related U.S. Application Data

(62) Division of application No. 14/066,889, filed on Oct. 30, 2013, now Pat. No. 9,153,483.

(51) Int. Cl.
*H01L 21/768* (2006.01)
*H01L 29/417* (2006.01)
(Continued)

(52) U.S. Cl.
CPC .. *H01L 21/76897* (2013.01); *H01L 21/28079* (2013.01); *H01L 21/28088* (2013.01);
(Continued)

(58) Field of Classification Search
CPC ......... H01L 2924/0002; H01L 2924/00; H01L 21/28; H01L 21/3081; H01L 21/3205;
(Continued)

(56) References Cited

U.S. PATENT DOCUMENTS 5,151,168 A * 9/1992 Gilton ................. H01L 21/2885
                                                    205/123
5,451,543 A * 9/1995 Woo ................... H01L 21/76816
                                                    257/E21.577

(Continued)

FOREIGN PATENT DOCUMENTS

CN   101483184 A   7/2009
CN   102768848 A   11/2012
(Continued)

OTHER PUBLICATIONS

Korean Application No. 10-2014-0148126, Office Action dated Oct. 22, 2015, 17 pgs.

*Primary Examiner* — Sophia T Nguyen
(74) *Attorney, Agent, or Firm* — Haynes and Boone, LLP

(57) ABSTRACT

A method of fabricating a semiconductor integrated circuit (IC) is disclosed. A first conductive feature and a second conductive feature are provided. A first hard mask (HM) is formed on the first conductive feature. A patterned dielectric layer is formed over the first and the second conductive features, with first openings to expose the second conductive features. A first metal plug is formed in the first opening to contact the second conductive features. A second HM is formed on the first metal plugs and another patterned dielectric layer is formed over the substrate, with second openings to expose a subset of the first metal plugs and the first conductive features. A second metal plug is formed in the second openings.

20 Claims, 9 Drawing Sheets

(51) Int. Cl.
| | |
|---|---|
| *H01L 21/28* | (2006.01) |
| *H01L 29/423* | (2006.01) |
| *H01L 21/8238* | (2006.01) |
| *H01L 21/8234* | (2006.01) |
| *H01L 29/49* | (2006.01) |
| *H01L 29/43* | (2006.01) |
| *H01L 27/092* | (2006.01) |
| *H01L 29/51* | (2006.01) |
| *H01L 21/321* | (2006.01) |
| *H01L 23/532* | (2006.01) |
| *H01L 23/528* | (2006.01) |
| *H01L 23/522* | (2006.01) |
| *H01L 23/485* | (2006.01) |
| *H01L 21/4763* | (2006.01) |
| *H01L 21/3105* | (2006.01) |
| *H01L 29/66* | (2006.01) |

(52) U.S. Cl.
CPC .... *H01L 21/28141* (2013.01); *H01L 21/3212* (2013.01); *H01L 21/7684* (2013.01); *H01L 21/7688* (2013.01); *H01L 21/76816* (2013.01); *H01L 21/76819* (2013.01); *H01L 21/76831* (2013.01); *H01L 21/76834* (2013.01); *H01L 21/76846* (2013.01); *H01L 21/76879* (2013.01); *H01L 21/823425* (2013.01); *H01L 21/823475* (2013.01); *H01L 21/823821* (2013.01); *H01L 21/823864* (2013.01); *H01L 21/823871* (2013.01); *H01L 21/823878* (2013.01); *H01L 23/485* (2013.01); *H01L 23/5226* (2013.01); *H01L 23/5283* (2013.01); *H01L 23/53214* (2013.01); *H01L 23/53233* (2013.01); *H01L 23/53257* (2013.01); *H01L 27/0924* (2013.01); *H01L 29/41775* (2013.01); *H01L 29/42372* (2013.01); *H01L 29/435* (2013.01); *H01L 29/4958* (2013.01); *H01L 29/4966* (2013.01); *H01L 29/517* (2013.01); *H01L 29/518* (2013.01); *H01L 21/31055* (2013.01); *H01L 21/4763* (2013.01); *H01L 21/76852* (2013.01); *H01L 21/76861* (2013.01); *H01L 21/76865* (2013.01); *H01L 21/76883* (2013.01); *H01L 21/76885* (2013.01); *H01L 21/823828* (2013.01); *H01L 23/53295* (2013.01); *H01L 29/66545* (2013.01); *H01L 2924/0002* (2013.01)

(58) Field of Classification Search
CPC ........... H01L 21/4763; H01L 21/76816; H01L 21/76877; H01L 23/485; H01L 29/41725; H01L 29/4232; H01L 29/66477; H01L 29/66545; H01L 21/76831; H01L 21/76846; H01L 21/32051; H01L 21/76852; H01L 21/76883; H01L 21/76819; H01L 21/31055; H01L 21/76861; H01L 21/76865; H01L 21/7684; H01L 21/823787; H01L 21/823821; H01L 21/28088; H01L 21/28079; H01L 21/823828; H01L 21/823864; H01L 29/66484; H01L 29/41766; H01L 29/435; H01L 29/4958; H01L 29/4966; H01L 27/0924; H01L 27/0928; H01L 21/76897; H01L 21/7688; H01L 21/76885; H01L 21/823425; H01L 21/76834; H01L 29/66515; H01L 29/41783; H01L 29/401; H01L 29/42372; H01L 29/41775; H01L 23/53214; H01L 23/53257; H01L 23/5283; H01L 21/31116; H01L 21/283; H01L 21/823475; H01L 21/823871; H01L 23/5226; H01L 23/53295; H01L 23/53233; H01L 21/76879

See application file for complete search history.

(56) References Cited

U.S. PATENT DOCUMENTS

| | | | | |
|---|---|---|---|---|
| 5,592,024 | A * | 1/1997 | Aoyama | H01L 21/76801 257/751 |
| 5,935,868 | A * | 8/1999 | Fang | H01L 21/76802 216/18 |
| 6,077,770 | A * | 6/2000 | Hsu | H01L 21/76814 257/E21.577 |
| 6,124,192 | A * | 9/2000 | Jeng | H01L 21/76897 257/E21.507 |
| 6,168,704 | B1 * | 1/2001 | Brown | C25D 5/022 205/118 |
| 6,174,800 | B1 * | 1/2001 | Jang | H01L 21/31111 257/E21.251 |
| 6,214,662 | B1 * | 4/2001 | Sung | H01L 27/115 257/E21.682 |
| 6,251,790 | B1 * | 6/2001 | Jeong | H01L 21/76816 257/E21.577 |
| 6,258,712 | B1 * | 7/2001 | Wang | H01L 21/31116 257/E21.252 |
| 6,348,414 | B1 * | 2/2002 | Yun | H01L 21/76802 257/E21.577 |
| 6,370,306 | B1 * | 4/2002 | Sato | B82Y 20/00 385/12 |
| 6,380,071 | B1 * | 4/2002 | Onuma | H01L 21/76802 257/760 |
| 6,387,759 | B1 * | 5/2002 | Park | H01L 21/8221 257/E21.614 |
| 6,445,050 | B1 * | 9/2002 | Chediak | H01L 21/76838 257/252 |
| 6,495,888 | B1 * | 12/2002 | Yamato | H01L 27/0629 257/328 |
| 6,511,912 | B1 * | 1/2003 | Chopra | H01L 21/28079 257/E21.175 |
| 6,518,671 | B1 * | 2/2003 | Yang | H01L 21/76829 257/758 |
| 6,528,418 | B1 * | 3/2003 | Kim | H01L 21/76897 257/E21.507 |
| 6,544,850 | B1 * | 4/2003 | Schnabel | H01L 27/10894 257/506 |
| 6,750,140 | B2 * | 6/2004 | Hohnsdorf | H01L 21/76802 257/E21.577 |
| 6,781,182 | B2 * | 8/2004 | Drynan | H01L 21/76831 257/306 |
| 6,787,469 | B2 * | 9/2004 | Houston | H01L 21/32139 257/E21.314 |
| 6,797,611 | B1 * | 9/2004 | Wu | H01L 21/76816 257/774 |
| 7,078,334 | B1 * | 7/2006 | Chowdhury | H01L 21/02063 216/41 |
| 7,157,333 | B1 * | 1/2007 | Kim | H01L 21/28282 257/E21.21 |
| 7,166,536 | B1 * | 1/2007 | Laermer | H01L 21/3065 257/E21.218 |
| 7,396,759 | B1 * | 7/2008 | van Schravendijk | H01L 21/76834 257/E21.575 |
| 7,563,701 | B2 * | 7/2009 | Chang | H01L 21/76897 257/E21.507 |
| 7,696,086 | B2 * | 4/2010 | Hsu | H01L 21/76807 257/E21.579 |
| 7,767,533 | B2 * | 8/2010 | Kim | H01L 21/76897 257/E21.409 |
| 7,811,941 | B1 * | 10/2010 | Becker | H01J 37/321 216/67 |
| 7,880,303 | B2 * | 2/2011 | Yu | H01L 21/76808 257/352 |

(56) References Cited

U.S. PATENT DOCUMENTS

| | | | |
|---|---|---|---|
| 7,956,386 B2* | 6/2011 | Bae | H01L 21/76805 257/213 |
| 8,288,238 B2* | 10/2012 | Huang | H01L 29/7391 257/E21.619 |
| 8,536,040 B1* | 9/2013 | Park | H01L 29/49 257/E21.198 |
| 9,105,497 B2* | 8/2015 | Hong | H01L 27/092 |
| 9,184,095 B2* | 11/2015 | Scheiper | H01L 21/76897 |
| 9,425,105 B1* | 8/2016 | Basker | H01L 21/823821 |
| 9,589,807 B1* | 3/2017 | Huang | H01L 21/283 |
| 9,941,162 B1* | 4/2018 | Chanemougame | H01L 21/76816 |
| 10,037,943 B2* | 7/2018 | Zhao | H01L 21/0214 |
| 2001/0005611 A1* | 6/2001 | Kim | H01L 27/10894 438/239 |
| 2002/0081799 A1* | 6/2002 | Kim | H01L 27/105 438/233 |
| 2002/0090837 A1* | 7/2002 | Chung | H01L 23/485 438/586 |
| 2002/0105088 A1* | 8/2002 | Yang | H01L 21/76801 257/774 |
| 2002/0187625 A1* | 12/2002 | Shimooka | H01L 21/7682 438/618 |
| 2003/0015732 A1* | 1/2003 | Park | H01L 21/76897 257/200 |
| 2003/0032219 A1* | 2/2003 | Nam | H01L 21/76897 438/128 |
| 2003/0127705 A1* | 7/2003 | Kwak | H01L 27/0629 257/536 |
| 2003/0162353 A1* | 8/2003 | Park | H01L 27/10855 438/253 |
| 2004/0110368 A1* | 6/2004 | Hui | H01L 21/76802 438/636 |
| 2004/0121599 A1* | 6/2004 | Aminpur | H01L 21/743 438/689 |
| 2004/0192026 A1* | 9/2004 | Chen | H01L 21/76802 438/629 |
| 2005/0085072 A1* | 4/2005 | Kim | H01L 21/76897 438/684 |
| 2006/0051948 A1* | 3/2006 | Kim | G01R 1/0483 438/597 |
| 2006/0263985 A1* | 11/2006 | Kang | H01L 21/82381 438/275 |
| 2007/0059919 A1* | 3/2007 | Ooka | H01L 21/76808 438/618 |
| 2007/0066047 A1* | 3/2007 | Ye | H01L 21/31144 438/620 |
| 2007/0077741 A1* | 4/2007 | Frohberg | H01L 21/76831 438/586 |
| 2007/0087554 A1* | 4/2007 | Louis | H01L 21/76831 438/618 |
| 2007/0093050 A1* | 4/2007 | Son | H01L 21/76831 438/618 |
| 2007/0123040 A1* | 5/2007 | Hwang | H01L 21/76804 438/672 |
| 2007/0249151 A1* | 10/2007 | Kadoya | H01L 21/76897 438/597 |
| 2008/0073694 A1* | 3/2008 | Willer | H01L 27/105 257/316 |
| 2008/0166874 A1* | 7/2008 | Deligianni | H01L 21/76879 438/675 |
| 2008/0253160 A1* | 10/2008 | Popp | G11C 5/063 365/72 |
| 2008/0254608 A1* | 10/2008 | Seo | H01L 21/76897 438/596 |
| 2008/0258310 A1* | 10/2008 | Fukumoto | H01L 21/31111 257/774 |
| 2009/0002118 A1* | 1/2009 | Gasparyan | B81B 3/0024 337/123 |
| 2009/0014796 A1* | 1/2009 | Liaw | H01L 27/11 257/347 |
| 2009/0159978 A1* | 6/2009 | Matsubara | H01L 21/76897 257/368 |
| 2009/0223043 A1* | 9/2009 | Hsu | G01R 1/07378 29/830 |
| 2009/0224327 A1* | 9/2009 | Liou | H01L 29/517 257/368 |
| 2009/0289324 A1* | 11/2009 | Goodlin | H01L 21/308 257/506 |
| 2010/0044869 A1* | 2/2010 | Zhang | H01L 21/76829 257/773 |
| 2010/0093168 A1* | 4/2010 | Naik | H01L 21/31144 438/618 |
| 2010/0197141 A1* | 8/2010 | Tu | H01L 21/76895 438/702 |
| 2011/0042752 A1* | 2/2011 | Mayuzumi | H01L 21/28518 257/369 |
| 2011/0062502 A1* | 3/2011 | Yin | H01L 21/76816 257/288 |
| 2011/0084289 A1* | 4/2011 | Tseng | G02F 1/136209 257/89 |
| 2011/0123783 A1* | 5/2011 | Sherrer | C25D 5/02 428/195.1 |
| 2011/0156107 A1* | 6/2011 | Bohr | H01L 21/76831 257/288 |
| 2011/0215409 A1* | 9/2011 | Li | H01L 21/28088 257/351 |
| 2011/0260264 A1* | 10/2011 | Luo | H01L 21/823814 257/412 |
| 2011/0269303 A1* | 11/2011 | Marxsen | H01L 21/31144 438/586 |
| 2011/0272767 A1* | 11/2011 | Yin | H01L 29/66575 257/412 |
| 2012/0025317 A1* | 2/2012 | Zhong | H01L 21/76897 257/368 |
| 2012/0032275 A1* | 2/2012 | Haran | H01L 21/28518 257/401 |
| 2012/0097919 A1* | 4/2012 | Speck | B82Y 20/00 257/13 |
| 2012/0100678 A1* | 4/2012 | Sako | H01L 21/76816 438/197 |
| 2012/0126421 A1* | 5/2012 | Lee | H01L 21/76816 257/774 |
| 2012/0146106 A1* | 6/2012 | Richter | H01L 21/28512 257/288 |
| 2012/0196432 A1* | 8/2012 | Yan | H01L 21/823814 438/586 |
| 2012/0241863 A1* | 9/2012 | Tsai | H01L 29/66545 257/347 |
| 2012/0264261 A1* | 10/2012 | Zhu | H01L 21/76897 438/197 |
| 2012/0273848 A1* | 11/2012 | Fan | H01L 21/823418 257/288 |
| 2012/0273899 A1* | 11/2012 | Wann | G06F 17/5068 257/401 |
| 2013/0015529 A1* | 1/2013 | Zhong | H01L 21/823807 257/369 |
| 2013/0020623 A1* | 1/2013 | Tsui | H01L 27/11519 257/300 |
| 2013/0119474 A1* | 5/2013 | Schultz | H01L 21/76895 257/368 |
| 2013/0137257 A1* | 5/2013 | Wei | H01L 21/76897 438/586 |
| 2013/0137260 A1* | 5/2013 | Alptekin | H01L 21/28518 438/664 |
| 2013/0175583 A1* | 7/2013 | Yuan | H01L 23/485 257/288 |
| 2013/0256767 A1* | 10/2013 | Pradhan | H01L 29/78 257/288 |
| 2013/0285157 A1* | 10/2013 | Yin | H01L 21/76807 257/401 |
| 2013/0295734 A1* | 11/2013 | Niebojewski | H01L 29/66477 438/197 |
| 2013/0299922 A1* | 11/2013 | Choi | H01L 21/82345 257/412 |
| 2013/0309856 A1* | 11/2013 | Jagannathan | H01L 21/845 438/587 |

(56) References Cited

U.S. PATENT DOCUMENTS

| | | | |
|---|---|---|---|
| 2013/0320412 A1* | 12/2013 | Yamasaki | H01L 21/823842 257/288 |
| 2013/0320452 A1* | 12/2013 | Wann | H01L 21/823425 257/368 |
| 2013/0320456 A1* | 12/2013 | Golonzka | H01L 29/66545 257/368 |
| 2014/0008713 A1* | 1/2014 | Toh | H01L 21/28273 257/321 |
| 2014/0051239 A1* | 2/2014 | Breyta | H01L 21/823475 438/586 |
| 2014/0077305 A1* | 3/2014 | Pethe | H01L 21/76895 257/368 |
| 2014/0209984 A1* | 7/2014 | Liang | H01L 23/53266 257/288 |
| 2014/0213042 A1* | 7/2014 | Lei | H01L 21/78 438/462 |
| 2014/0252433 A1* | 9/2014 | Shieh | H01L 21/76895 257/288 |
| 2014/0252630 A1* | 9/2014 | Chang | H01L 23/528 257/763 |
| 2014/0264499 A1* | 9/2014 | Yuan | H01L 23/485 257/288 |
| 2014/0306291 A1* | 10/2014 | Alptekin | H01L 29/41725 257/369 |
| 2014/0346575 A1* | 11/2014 | Chen | H01L 21/76897 257/288 |
| 2014/0353734 A1* | 12/2014 | Xie | H01L 21/283 257/288 |
| 2015/0017768 A1* | 1/2015 | Wann | H01L 21/823425 438/230 |
| 2015/0021683 A1* | 1/2015 | Xie | H01L 29/6653 257/330 |
| 2015/0041909 A1* | 2/2015 | Bouche | H01L 21/823828 257/369 |
| 2015/0048455 A1* | 2/2015 | Basker | H01L 27/088 257/368 |
| 2015/0069625 A1* | 3/2015 | Li | H01L 21/76846 257/774 |
| 2015/0097247 A1* | 4/2015 | Cai | H01L 27/0623 257/370 |
| 2015/0118837 A1* | 4/2015 | Shieh | H01L 21/76879 438/586 |
| 2015/0170966 A1* | 6/2015 | Tung | H01L 21/76816 438/618 |
| 2015/0206804 A1* | 7/2015 | Liou | H01L 21/823475 257/368 |
| 2015/0214113 A1* | 7/2015 | Bouche | H01L 21/823431 438/283 |
| 2015/0236106 A1* | 8/2015 | Zaleski | H01L 29/41758 257/383 |
| 2015/0307997 A1* | 10/2015 | Lockard | B81C 1/00373 427/58 |
| 2015/0332962 A1* | 11/2015 | Chen | H01L 21/76819 257/288 |
| 2015/0364371 A1* | 12/2015 | Yen | H01L 21/823475 257/401 |
| 2016/0027692 A1* | 1/2016 | Shieh | H01L 21/76879 438/586 |
| 2016/0043075 A1* | 2/2016 | Lavoie | H01L 27/088 257/365 |
| 2016/0064514 A1* | 3/2016 | Bouche | H01L 29/66545 257/401 |
| 2016/0181399 A1* | 6/2016 | Jun | H01L 21/76816 438/294 |
| 2016/0336271 A1* | 11/2016 | Sell | H01L 21/76897 |
| 2016/0379925 A1* | 12/2016 | Ok | H01L 21/76895 257/288 |
| 2017/0053804 A1* | 2/2017 | Lu | H01L 21/28132 |
| 2017/0103915 A1* | 4/2017 | Tsai | H01L 21/76802 |
| 2017/0194211 A1* | 7/2017 | Lai | H01L 21/76897 |
| 2017/0287780 A1* | 10/2017 | Park | H01L 21/76897 |
| 2017/0288037 A1* | 10/2017 | Zhong | H01L 21/76897 |
| 2018/0040511 A1* | 2/2018 | Kamineni | H01L 21/76816 |
| 2018/0211875 A1* | 7/2018 | Basker | H01L 21/76897 |

FOREIGN PATENT DOCUMENTS

| | | |
|---|---|---|
| CN | 103199063 A | 7/2013 |
| JP | 2013-516083 A | 5/2013 |
| KR | 10-0630749 B1 | 10/2006 |
| KR | 10-2009-0044528 A | 5/2009 |

* cited by examiner

METHOD OF SEMICONDUCTOR INTEGRATED CIRCUIT FABRICATION

CROSS-REFERENCE TO RELATED APPLICATIONS

This application is a division of U.S. application Ser. No. 14/066,889, filed on Oct. 30, 2013, titled "Method of Semiconductor Integrated Circuit Fabrication", the entire disclosure of which is incorporated herein by reference.

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, challenges rise to develop a more robust metal plug formation for interconnection structures. It is desired to have improvements in this area

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIG. 2 and a semiconductor device 500 shown in FIGS. 3A-3B, 4 to 8 for the sake of example. It is understood that additional steps can be provided before, during, and after the method, and some of the steps described can be replaced or eliminated for other embodiments of the method.

Figure 2:
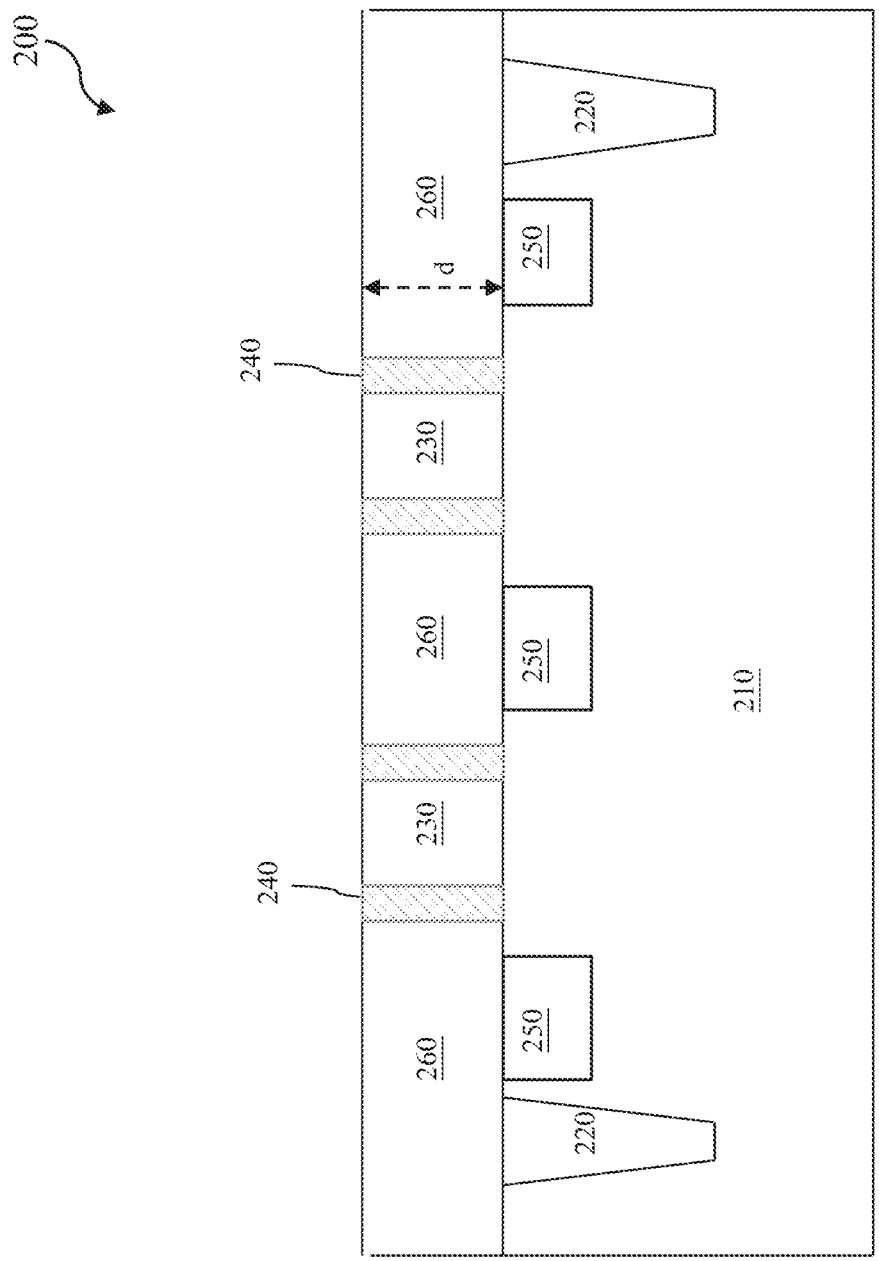
FIGS. 2 to 8 are cross-sectional views of an example semiconductor integrated circuit (IC) at fabrication stages constructed according to the method of FIG. 1.

Referring to FIGS. 1 and 2, the method 100 begins at step 102 by receiving a semiconductor device precursor 200. The semiconductor device precursor 200 includes a substrate 210. In the present embodiment, the substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor device precursor 200 also includes one or more first conductive features 230. In one embodiment, the first conductive feature 230 may include high-k/metal gates (HK/MGs), a three-dimension HK/MGs wrapping over a fin-like structure. As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. Additionally, sidewall spacers 240 are formed on the sidewalls of the HK/MGs. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by deposition and dry etching processes known in the art.

In another embodiment, the first conductive features 230 include electrodes, capacitors, resistors or a portion of a resistor. In yet another embodiment, the first conductive features 230 include a portion of the interconnect structure. For example, the first conductive features 230 include contacts, metal vias, or metal lines.

The semiconductor device precursor 200 also includes second conductive features 250 in the substrate 210. A top surface to the second conductive feature 250 may not be at a same horizontal level as a top surface of the first conductive feature 230. In one embodiment, the top surface of the second conductive features 250 are horizontally below the top surface of the first conductive features 230 with a depth d, as shown in FIG. 2. In one embodiment, the second conductive features 250 include doped regions (such as sources or drains), or gate electrodes. In another embodiment, the second conductive features 250 include electrodes, capacitors, resistors or a portion of a resistor, or a portion of the interconnect structure.

The semiconductor device precursor 200 also includes a first dielectric layer 260 deposited over the substrate 210, including between/over each of the first conductive features 230 and over the second conductive features 250. The first dielectric layer 260 includes silicon oxide, silicon nitride, oxynitride, a dielectric material having a dielectric constant (k) lower than thermal silicon oxide (therefore referred to as low-k dielectric material layer), or other suitable dielectric material layer. The first dielectric layer 260 includes a single layer or multiple layers. A CMP may be performed to remove excessive the first dielectric layer 260 to expose the top surface of the first conductive features 230, as well as to provide a substantially planar top surface for the first conductive features 230 and the first dielectric layer 260.

Figure 3A:
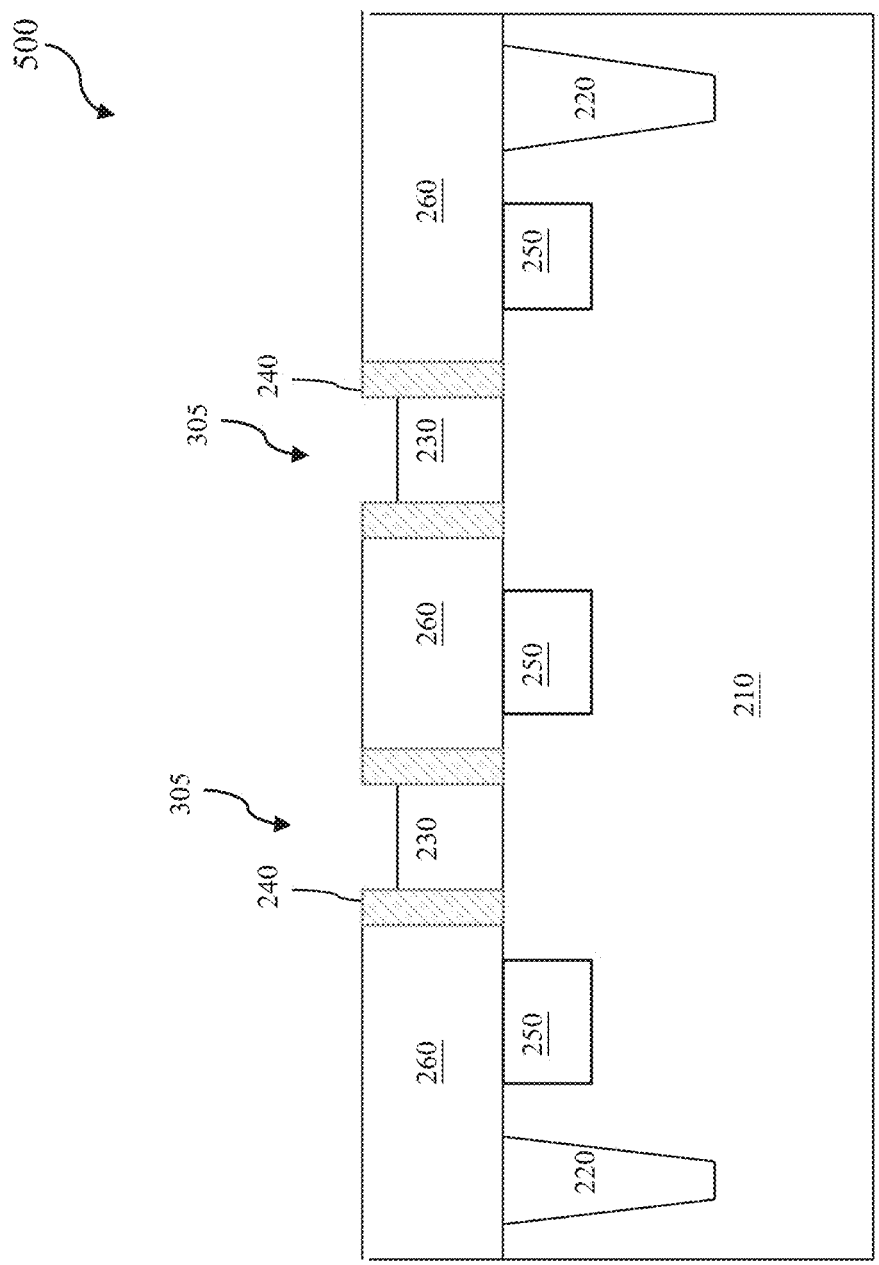
Figure 3B:
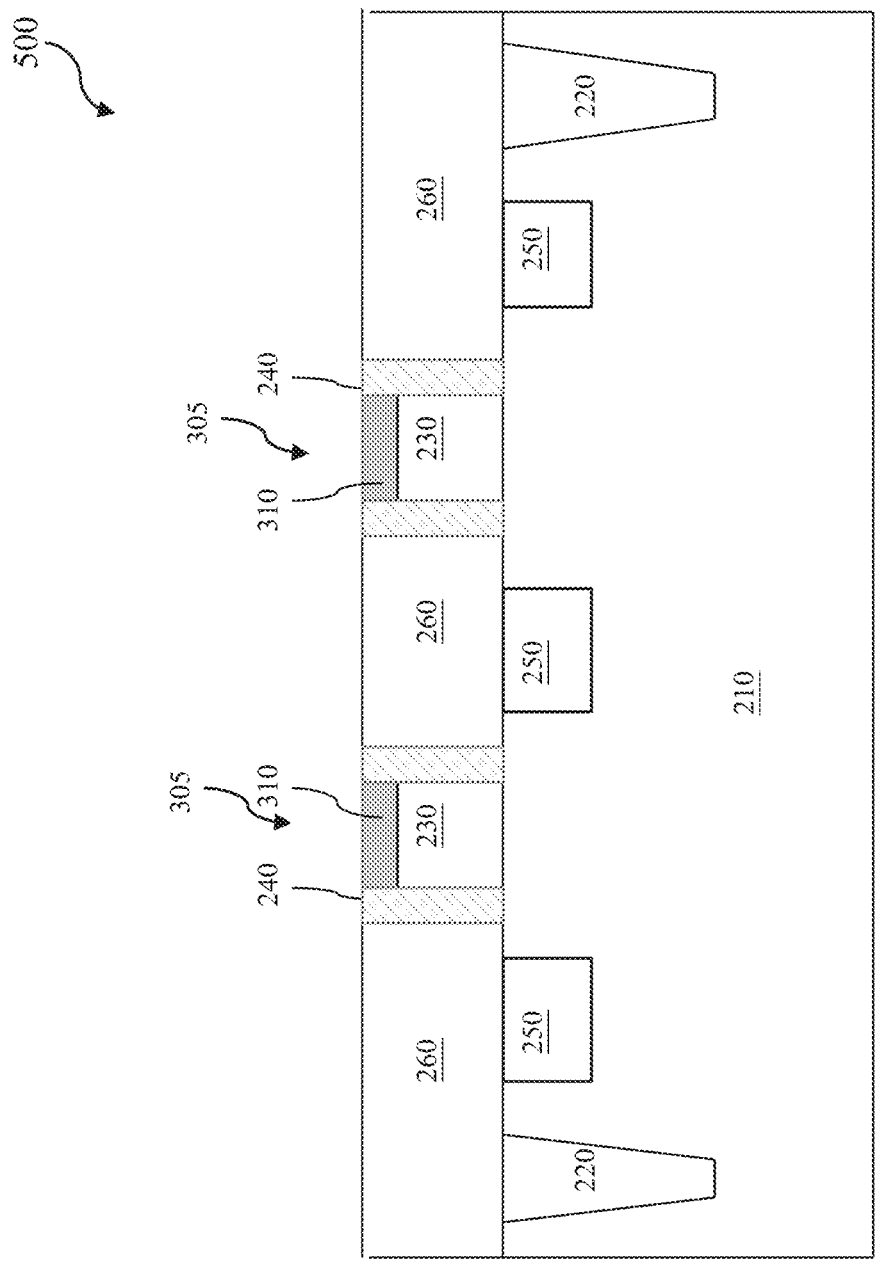

Referring FIGS. 1 and 3A-3B, once the semiconductor device precursor 200 is received, the method 100 proceeds to step 104 by forming a first hard mask (HM) layer 310 on the first conductive features 230. In one embodiment, the first conductive features 230 are recessed first by a selective etch to form first trenches 305, as shown in FIG. 3A. The selective etch may include a wet etch, a dry etch, or a combination thereof. In another embodiment, the first trenches 305 are formed by proper processes including patterning and etching. The first trenches 305 are then filled in by the first HM layer 310 by suitable techniques, such as chemical vapor deposition (CVD), or physical vapor deposition (PVD). The first HM layer 310 includes titanium oxide, tantalum oxide, silicon nitride, silicon oxide, silicon carbide, and silicon carbide nitride. In the present embodiments, the HM layer 310 is different from the first dielectric layer 260 to achieve etching selectivity during a subsequent etch, which will be described later. In one embodiment, a CMP process is then performed to remove excessive the first HM layer 310. The CMP process is controlled such that the first HM layer 310 above the first trenches 305 are removed, thus the portion of the first HM layer 310 in the first trenches 305 become a top layers of the first conductive features 230, as shown in FIG. 3B.

Figure 4:
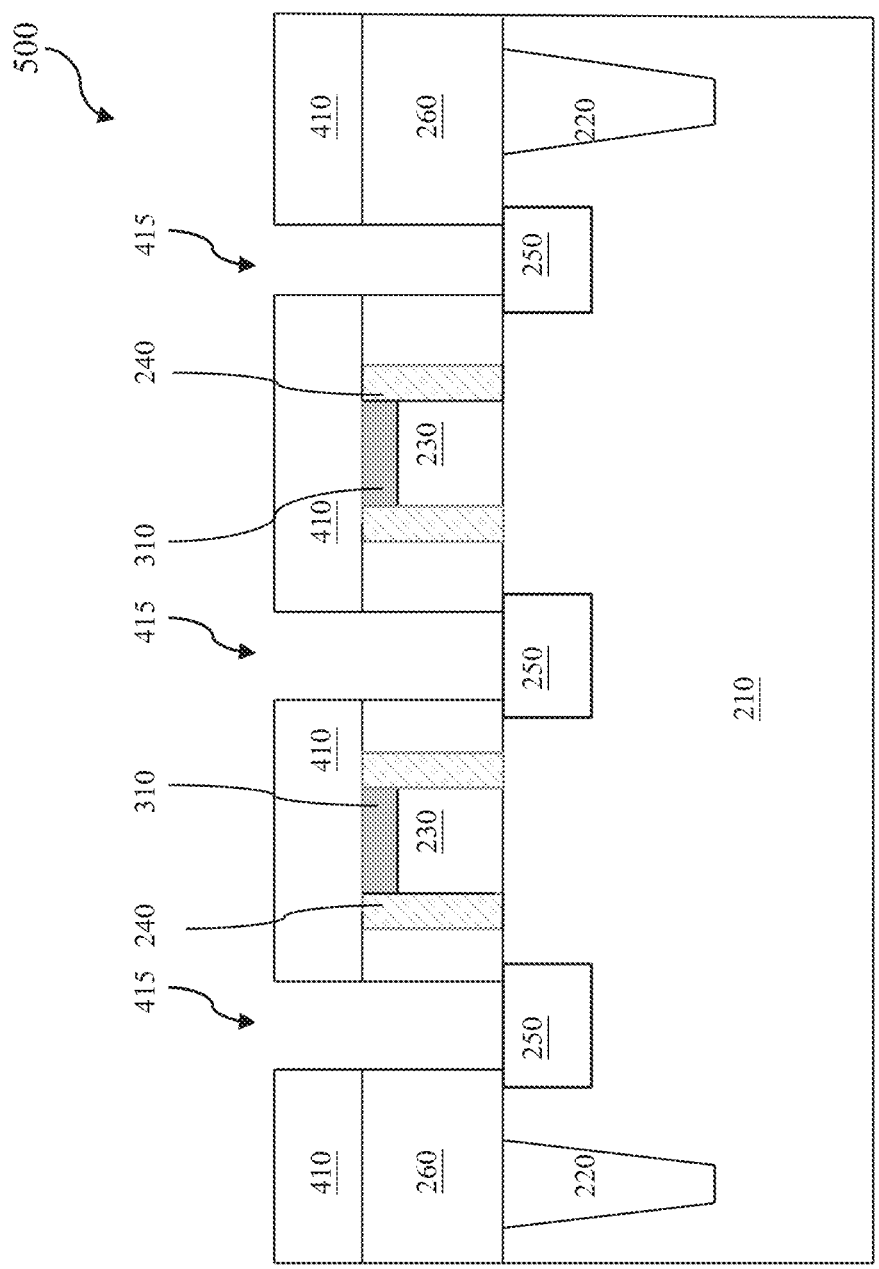

Referring FIGS. 1 and 4, the method 100 proceeds to step 106 by forming a second dielectric layer 410, with first openings 415, over the substrate 210. The second dielectric layer 410 is similar in many respects to the first dielectric layer 260 discussed above in association with FIG. 2. At the bottom of the first openings 415, a portion of the second conductive features 250 are exposed. The first openings 415 may be formed by lithography patterning and etching processes. In present embodiment, the first openings 415 are formed aligning to the respective second conductive features 250 and not aligning to the first conductive features 230, as shown in FIG. 4. With a substantial same depth of the first openings 415, an etching process window may be improved. In one embodiment, the first openings 415 are formed by an etch process that selectively removes the second dielectric layer 410 and the first dielectric layer 260 but substantially does not etch the sidewall spacers 240 and the first HMs 310. Thus, with protection of the sidewall spacers 240 and the first HMs 310, constrains of overlay in first opening patterning process is relaxed and etching process window is improved as well.

Figure 5:
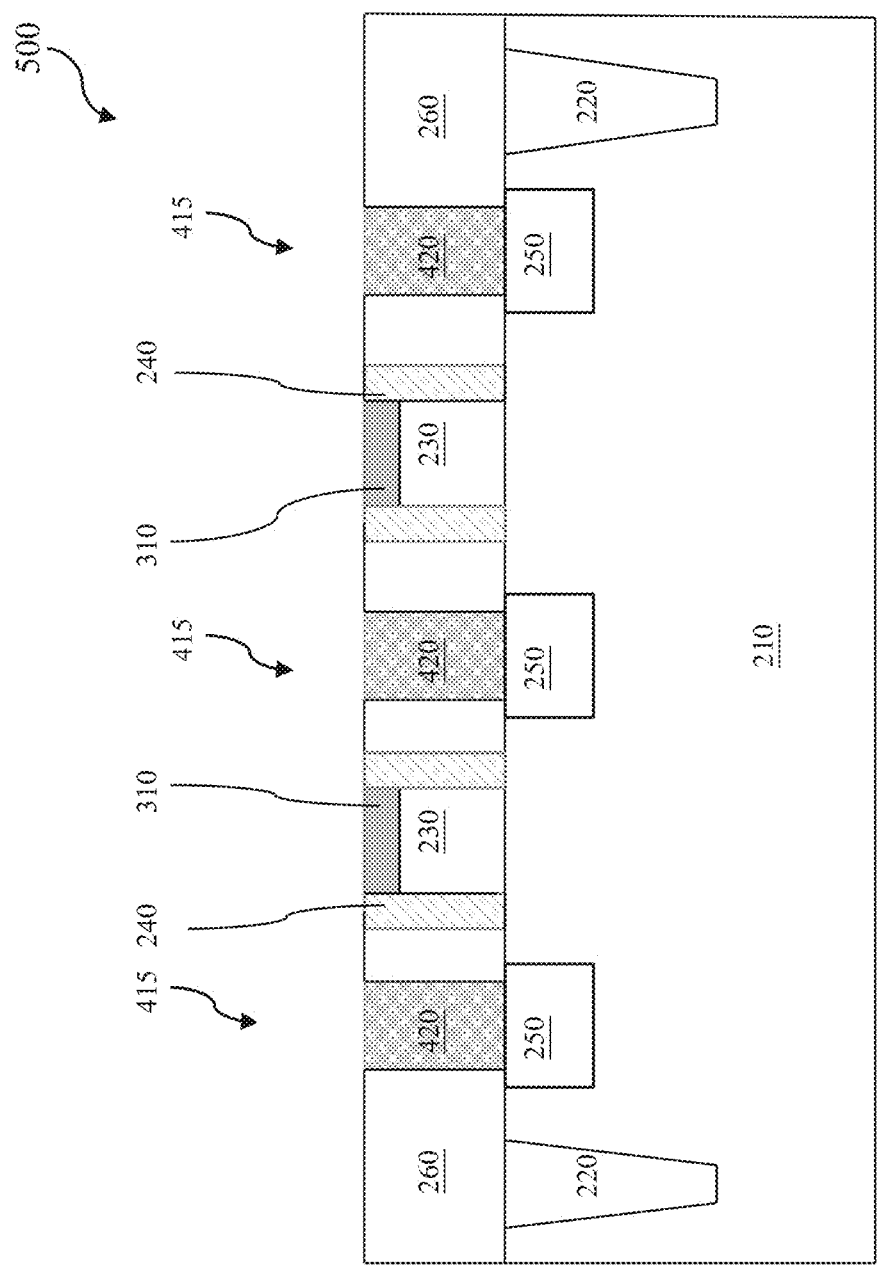

Referring to FIGS. 1 and 5, the method 100 proceeds to step 108 by forming first metal plugs 420 in the first openings 415 to form full contacts extending down to the second conductive features 250. In one embodiment, a first barrier layer is formed in the first openings 415 first by a proper deposition technique, such as PVD and CVD. The first barrier layer may include a metal and is electrically conductive but does not permit inter-diffusion and reactions between the first dielectric material layer 260 and a first metal layer 420 to be filled in the first openings 415. The first barrier layer may include refractory metals and their nitrides. In various examples, the first barrier layer includes TiN, TaN, Co, WN, TiSiN, TaSiN, or combinations thereof. The first barrier layer may include multiple films.

The first metal layer 420 then fills in the first openings 415, as well as over the first barrier layer. The first metal layer 420 may include copper (Cu), aluminum (Al), tungsten (W), copper or copper alloy, such as copper magnesium (CuMn), copper aluminum (CuAl) or copper silicon (CuSi), or other suitable conductive material. The first metal layer 420 may be deposited by y PVD, CVD, metal-organic chemical vapor deposition (MOCVD), or plating.

In the present embodiment, after the first openings 415 are filled by the first metal layer 420, a recess is performed to etch back the excessive first metal layer 420, as well as the excessive first barrier layer, and the second dielectric layer 410 and provide a substantially planar surface. The recess is controlled that it etches back until the top surface of the first HMs 310 are exposed. As an example, a CMP is performed to polish back the excessive first metal layer 420, as well as the excessive first barrier layer, and the second dielectric layer 410. Thus a portion of the first metal layer 420, which fills in the first openings 415, forms the first metal plugs 420. By filling in the first openings 415 first and then recessing back, the first metal plugs 420 are formed with a self-alignment nature. Also combining with the sidewall spacers 240, the first HMs 310 provide an electrical isolation to prevent electrical short between the first metal plugs 425 and the first conductive features 230.

Figure 6:
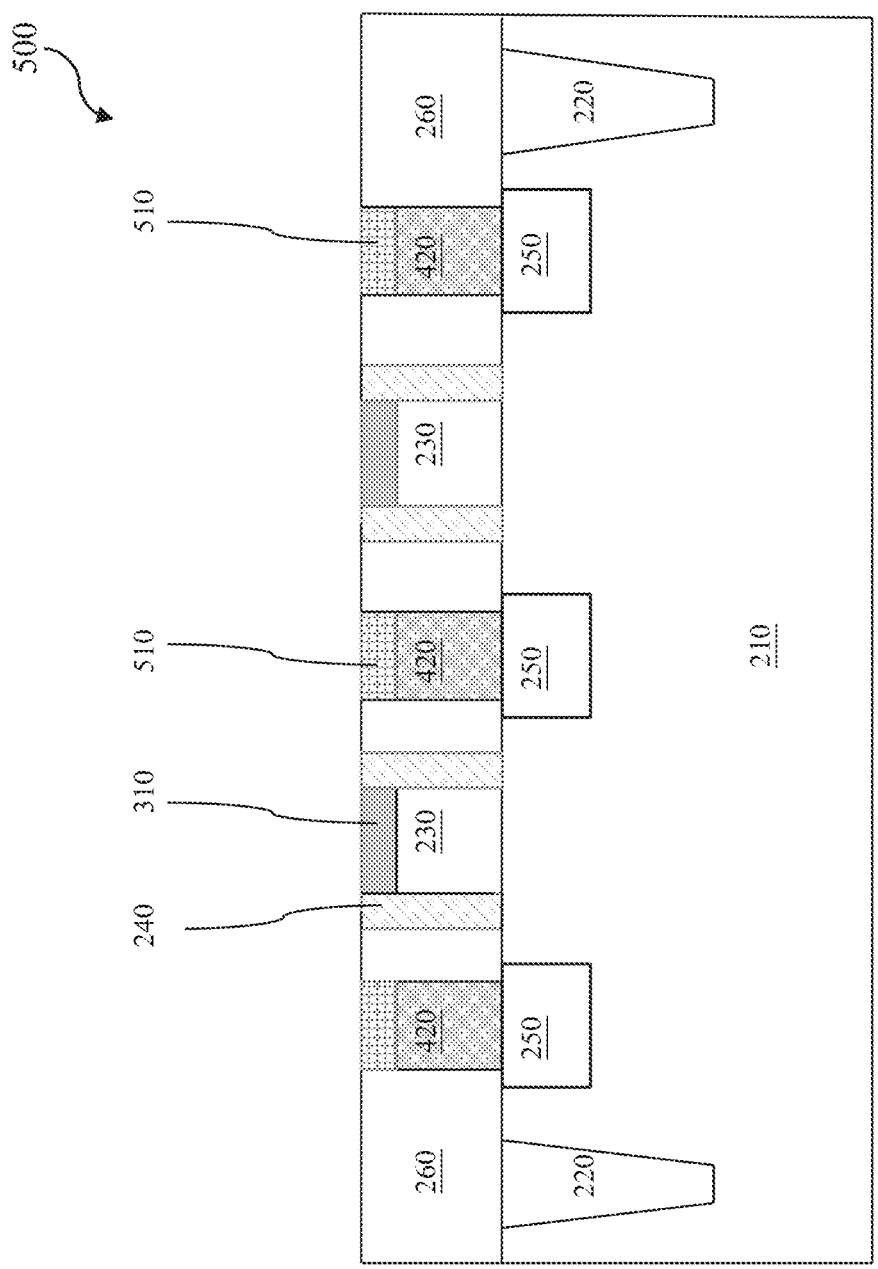

Referring to FIGS. 1 and 6, the method 100 proceeds to step 110 by forming second HMs 510 on the first metal plugs 425. The second HMs 510 are formed similarly in many respects to the first HMs 310 discussed above in association with FIGS. 3A and 3B. The second HM layer 510 includes titanium oxide, tantalum oxide, silicon nitride, silicon oxide, silicon carbide, and silicon carbide nitride. In one embodiment, the first metal plugs 420 are recessed first by a selective etch to form second trenches. The second trenches are then filled in by the second HM layer 510 and a recess process is then performed to remove excessive the HM layer 510. Therefore the portion of the second HM layer 510 filled in the second trenches become top layers of the first metal plugs 420. In the present embodiment, the recess is controlled that it etches back the second HM layer 510 until the top surface of the first HMs 310 are exposed. Thus, as top layers on the first conductive features 230 and the first metal plugs 420, respectively, the firsts HM 310 and the second HMs 510 provide isolation layers to prevent electric short between them and a to-be-formed second metal plug, which will be described later.

Figure 7:
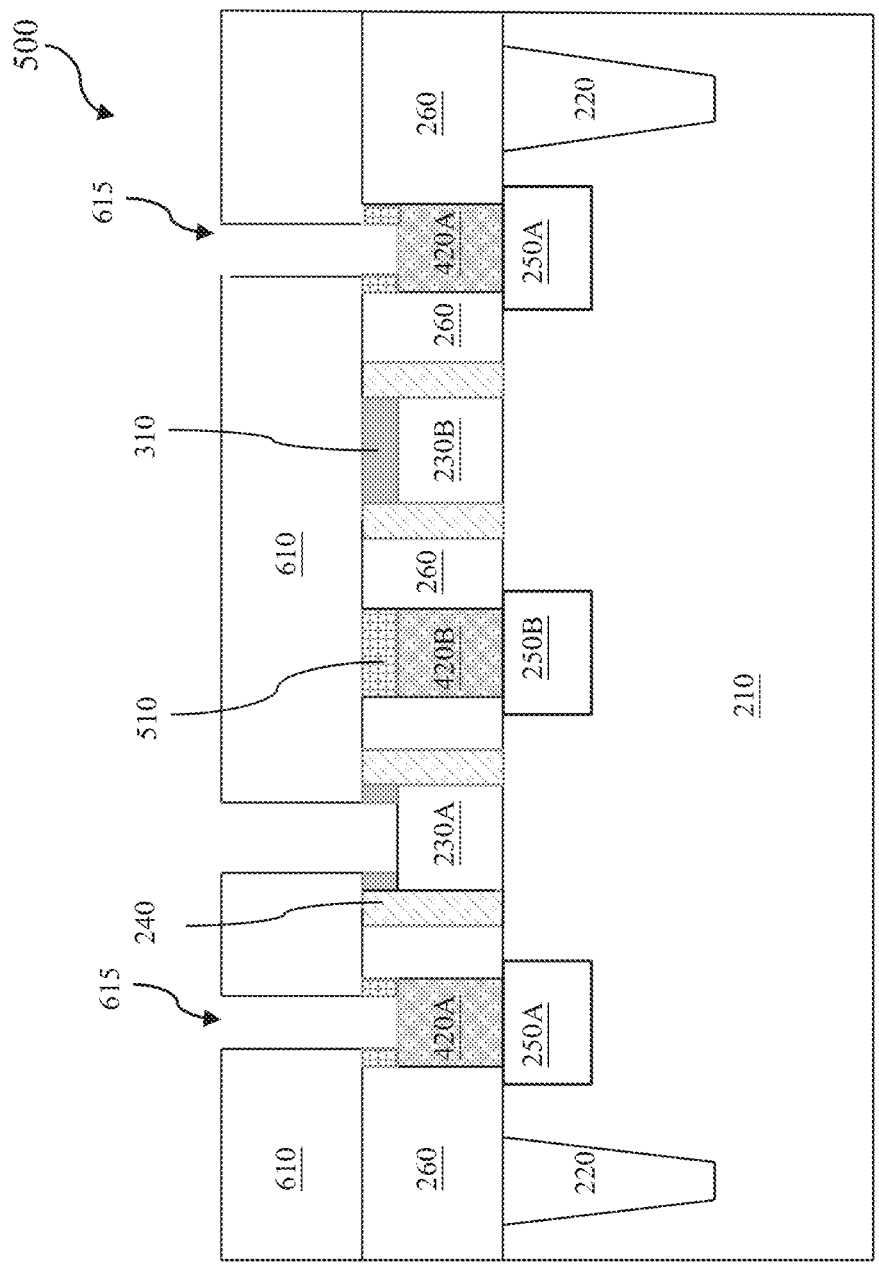

Referring to FIGS. 1 and 7, the method 100 proceeds to step 112 by forming the third dielectric layer 610, with second openings 615, over the substrate 210, including over the first conductive features 230 and the first metal plugs 420. The third dielectric layer 610 and the second openings 615 are formed similarly in many respects to the second dielectric layer 410 and the first openings 415 discussed above in association with FIG. 4. The second openings 615 are formed to expose a subset of the first conductive features 230 and the first metal plugs 420 (which connecting with the second conductive feature 250). For the sake of clarity to better describing the method 100, now labeling the subset of the first conductive features 230, the first metal plugs 420 and the second conductive features 250 with the reference number 230A, 420A and 250A, respectively, and labeling rest of the first conductive features 230, the first metal plugs 420 and the second conductive feature 250 with the reference number 230B, 420B and 250B, respectively. In one embodiment, the second openings 615 are formed by lithography patterning and etching processes. The first HM 310 on the first conductive feature 230A and the second HM 510 on the first metal plug 420A are moved during the etch process as well. With a substantial same depth of the second opening 615, an etching process window is improved.

Figure 8:
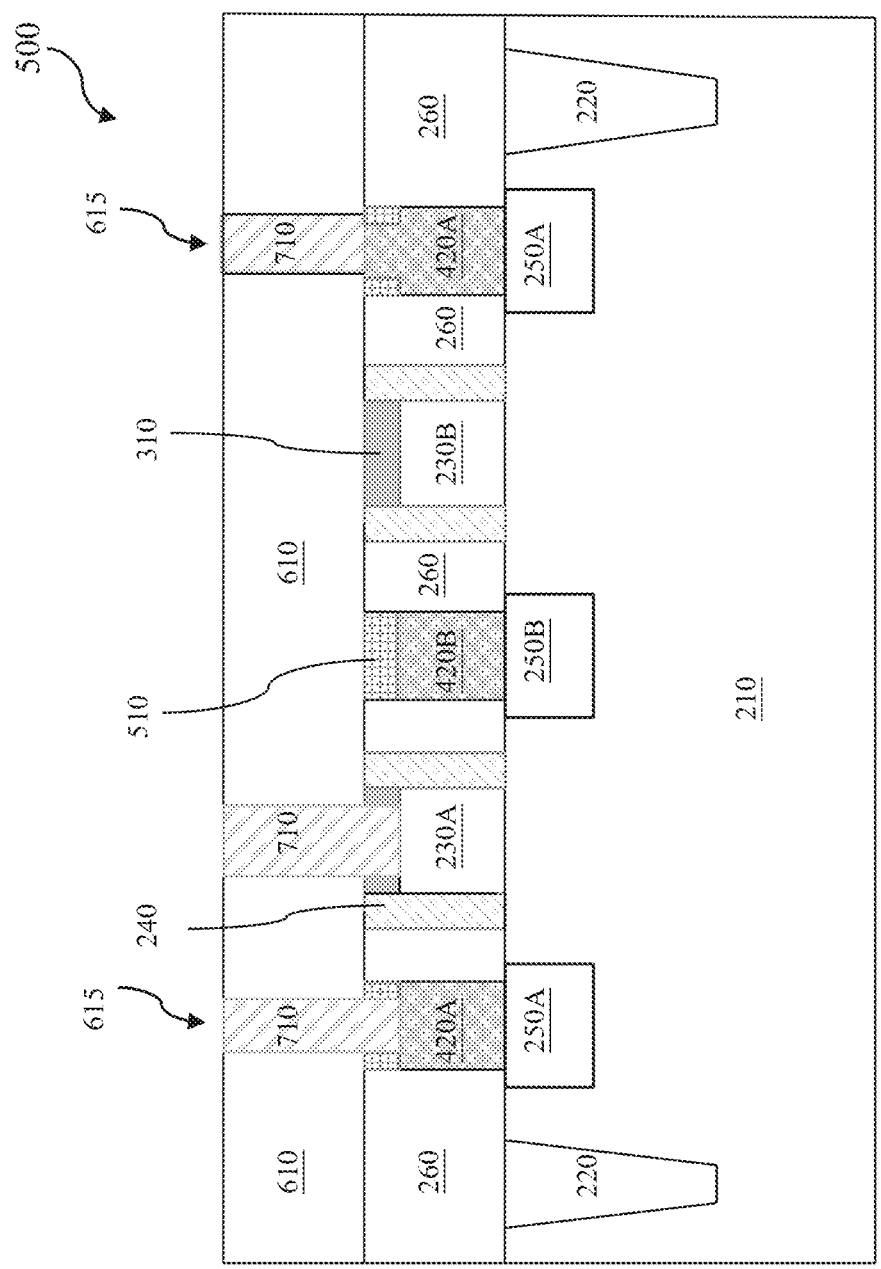

Referring to FIGS. 1 and 8, the method 100 proceeds to step 114 by forming a second metal plugs 710 in the second openings 615 to form a full contact extending down to the first conductive features 230A and the first metal plugs 420A. Thus, the second metal plugs 710 are formed similarly in many respects to the first metal plug 420 discussed above in association with FIG. 5. In one embodiment, a second barrier layer is formed in the second openings 615 first. The second barrier layer may include refractory metals and their nitrides. In various examples, the second barrier layer includes TiN, TaN, Co, WN, TiSiN, TaSiN, or combinations thereof. The second barrier layer may include multiple films.

The second metal layer 710 then fills in the second openings 615, including depositing over the second barrier layer. The second metal layer 710 may include copper (Cu), aluminum (Al), tungsten (W), copper or copper alloy, such as copper magnesium (CuMn), copper aluminum (CuAl) or copper silicon (CuSi), or other suitable conductive material. A recess is then performed to etch back the excessive second metal layer 710, as well as the excessive second barrier layer, to form the second metal plugs 710 and a substantial planar surface with the third dielectric layer 610.

By filling in the second openings 615 first and then recessing back, the second metal plugs 710 are formed with a self-alignment nature. During the forming of the second metal plugs 710, the first HMs 310 and the second HMs 510 enhance protection between the first conductive features 230B and the first metal plugs 420B to the second metal plugs 710, which relaxes process constrains and improves process window.

In the present embodiment, a vertical conductive connection for the second conductive feature 250A, is provided by two metal plugs on top of each other, the second metal plug 710 on top of the first metal plug 420A, instead of one metal plug. Usually during forming an opening, the opening becomes narrower as it extends deeper. Thus, to achieve a targeted bottom size of an opening, a deeper opening usually need a wider opening at its top. Therefore a spacing separating two adjacent openings may become smaller. A smaller separating spacing may make process window be narrower, such as a smaller tolerance for misalignment. It may also lead more constrains in reducing device packing density. Thus, instead of one deeper opening, in this two plug scheme, each opening forms as a portion of the deeper opening and therefore a smaller top width (comparing with a deeper opening) may be achieved.

Additional steps can be provided before, during, and after the method 100, and some of the steps described can be replaced, eliminated, or moved around for additional embodiments of the method 100. For example, prior to depositing the second dielectric layer 410 (in step 106), an etch stop layer is deposited over the substrate to enhance etch process control in recessing the first metal layer 420 (in step 108). The device 500 may undergo further CMOS or MOS technology processing to form various features and regions.

Based on the above, the present disclosure offers a method for fabricating a semiconductor device. The method employs forming a hard mask as a top layer of a conductive feature to protect the respective conductive feature during a formation of a metal plug to connect another conductive feature. The method also employs forming a metal plug with a self-alignment nature. The method demonstrates an integration of interconnection with a relaxed process constrains, enhanced electrical short protection and improved process window.

The present disclosure provides many different embodiments of fabricating a semiconductor IC that provide one or more improvements over existing approaches. In one embodiment, a method for fabricating a semiconductor integrated circuit (IC) includes providing a first conductive feature and a second conductive feature in a substrate. The first and the second conductive features are separated by a first dielectric layer. A top surface of the second conductive feature is below a top surface of the first conductive feature, horizontally. The method also includes forming a first hard mask (HM) as a top layer on the first conductive feature, depositing a second dielectric layer over the first and the second conductive features, forming the first openings in the first and the second dielectric layers to expose the second conductive features, forming a first metal plug in the first openings to contact the second conductive features, forming a second HM as a top layer on the first metal plugs, depositing a third dielectric layer over the first conductive feature and the first metal plugs, forming second openings in the third dielectric layer to expose a subset of the first conductive features and the first metal plugs and forming second metal plugs in the second openings to connect to the subset of first conductive features and the first metal plugs.

In another embodiment, a method for fabricating a semiconductor IC includes providing a device precursor. The device precursor includes high-k/metal gates (HK/MGs) in a substrate, sidewall spacers along HK/MG sidewalls, conductive features in the substrate and a first dielectric layer to separate the HK/MGs and the second conductive features. A top surface of the conductive feature is below a top surface of the HK/MGs, horizontally. The method also includes recessing the HK/MGs to form first trenches on the HK/MGs, forming first hard masks (HM) in the first trenches, therefore the first HMs are top layers on the HK/MGs. The method also includes depositing a second dielectric layer over the HK/MGs and the conductive features, forming first openings in the second and the first dielectric layers to expose the conductive features, filling in the first openings with a first metal layer to contact the conductive features, recessing the first metal layer and the second dielectric layer until the first HMs are exposed. Therefore first metal plugs are formed in the first openings. The method also includes forming a second HM as a top layer on the first metal plugs, depositing a third dielectric layer over the HK/MGs and the first metal plugs, forming second openings in the third dielectric layer to expose a subset of the HK/MGs and the first metal plugs and forming second metal plugs in the second openings to connect with the subset of HK/MGs and the first metal plugs.

In yet another embodiment, a method for fabricating a semiconductor IC includes providing a first conductive feature and a second conductive feature in a substrate, separated by a first dielectric layer. The method also includes forming a first hard mask (HM) as a top layer on the first conductive feature, forming a first patterned dielectric layer over the first and the second conductive features. Therefore the first patterned dielectric layer having openings to expose the second conductive features. The method also includes forming a first metal plug in the first openings to connect the second conductive features, forming a second HM as a top layer on the first metal plugs, forming a second patterned dielectric layer over the first conductive features and the first metal plugs. Therefore the second patterned dielectric layer having second openings to expose the first conductive feature and a subset of the first metal plugs and forming second metal plugs in the second openings to connect to connect the first conductive feature and the subset of the first metal plugs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
    providing a first conductive feature on a substrate and a second conductive feature in the substrate, wherein the first conductive feature is surrounded by a spacer and by a first dielectric layer;
    forming a first hard mask (HM) as a top layer on the first conductive feature, wherein the forming the first HM includes forming a first trench by removing a portion of the first conductive feature and thereafter filling the first trench with a dielectric material;
    depositing a second dielectric layer directly on the first dielectric layer and on the first HM;
    selectively etching a first opening through the first and second dielectric layers, wherein the first opening exposes the second conductive feature, and wherein the selectively etching is performed such that the first and second dielectric layers have an etching selectivity with the first HM;
    forming a first metal plug in the first opening to connect the second conductive feature;
    removing the second dielectric layer;
    forming a second HM as a top layer on the first metal plug;
    forming a third dielectric layer over the first dielectric layer, over the first HM, and over the second HM;
    simultaneously etching a plurality of second openings through the third dielectric layer such that the second openings are isolated from each other, wherein at least a first one of the second openings extends vertically through the first HM and exposes the first conductive feature, and wherein at least a second one of the second openings extends vertically through the second HM and exposes the first metal plug; and
    forming second metal plugs in the second openings to connect to the first conductive feature and the first metal plug.

2. The method of claim 1, wherein the forming of the second HM includes:
    recessing the first metal plug to form a second trench;
    depositing a second HM material over the substrate, including a first portion filling in the second trench and a second portion extending beyond the second trench; and
    removing the second portion of the second HM material.

3. The method of claim 1, wherein the first conductive feature includes a gate stack.

4. The method of claim 3, wherein the second conductive feature includes a source/drain region.

5. The method of claim 1, wherein portions of the second HM still remain on the first metal plug after the forming of the second metal plugs.

6. The method of claim 1, wherein at least a first one of the second metal plugs is formed to have a different lateral dimension from at least a second one of the second metal plugs.

7. The method of claim 1, wherein the first opening is etched such that the first opening is spaced apart from the spacer by a portion of the first dielectric layer.

8. The method of claim 1, wherein the forming the first trench comprises performing an etching process to an entire upper surface of the first conductive feature.

9. A method comprising:
receiving a substrate having a first dielectric layer disposed thereupon, a first conductive feature and spacers disposed within the first dielectric layer, and a plurality of second conductive features disposed within the substrate;
recessing an entire upper portion of the first conductive feature to form a first trench, wherein side surfaces of the first trench are defined by the spacers, and wherein a bottom surface of the first trench is defined by a remaining portion of the first conductive feature after the recessing;
filling the first trench to form a first hard mask, wherein the first dielectric layer, the first hard mask, and the spacers are formed to have substantially co-planar upper surfaces;
forming a second dielectric layer directly on the first dielectric layer and the first hard mask;
recessing a portion of the first dielectric layer and a portion of the second dielectric layer to define a plurality of second trenches that each extends through the first and second dielectric layers and that each exposes a respective one of the second conductive features, wherein the recessing is performed using an etching process in which the first and second dielectric layers have an etching selectivity with the first hard mask;
forming a plurality of first plugs in the second trenches, wherein each of the first plugs is electrically coupled to a respective one of the second conductive features;
removing the second dielectric layer;
recessing a portion of each of the first plugs to define a plurality of third trenches that exposes an upper surface of the first plugs;
forming a plurality of second hard masks within the third trenches;
forming a third dielectric layer over the first dielectric layer, the spacers, the first hard mask, and the second hard masks;
forming a plurality of second plugs that each extends vertically through the third dielectric layer and through the second hard masks to electrically couple to the first plug, wherein a first one of the second plugs is formed to be adjacent to the first conductive feature, and wherein a second one of the second plugs is formed to be away from the first conductive feature such that at least one of the first plugs is located between the first conductive feature and the second one of the second plugs; and
forming a third plug that extends vertically through the third dielectric layer and through the first hard mask to electrically couple to the first conductive feature.

10. The method of claim 9, wherein the first conductive feature includes a gate feature.

11. The method of claim 10, wherein the second conductive features each includes a source/drain feature.

12. The method of claim 9, wherein the recessing of the first dielectric layer to define the second trenches uses an etchant selected to avoid etching of the first hard mask to expose the first conductive feature.

13. The method of claim 9, wherein the forming of the second plugs includes:
recessing a first portion of the third dielectric layer and the second hard masks to define a plurality of fourth trenches that extends vertically through the third dielectric layer and the second hard masks, wherein the fourth trenches expose the first plugs; and
depositing the second plugs within the fourth trenches.

14. The method of claim 13, wherein the forming of the third plug includes:
recessing a second portion of the third dielectric layer and the first hard mask to define a fifth trench that extends vertically through the third dielectric layer and the first hard mask, wherein the fifth trench exposes the first conductive feature, and wherein the recessing of the first portion of the third dielectric layer and the recessing of the second portion of the third dielectric layer are simultaneously performed; and
depositing the third plug within the fifth trench.

15. The method of claim 9, wherein the first plug, the second plugs, and the third plug are all visible in a same cross-sectional side view.

16. A method comprising:
receiving a substrate having disposed thereupon:
a first conductive feature and a second conductive feature, wherein a top surface of the first conductive feature is above a top surface of the second conductive feature;
a first dielectric layer disposed alongside the first conductive feature and on the second conductive feature; and
a spacer disposed between the first conductive feature and the first dielectric layer;
partially removing the first conductive feature and forming a first hard mask on a remaining portion of the first conductive feature, wherein a top surface of the first hard mask is substantially coplanar with a top surface of the first dielectric layer and with a top surface of the spacer, and wherein the first hard mask and the first dielectric layer have different material compositions;
forming a second dielectric layer directly on the first dielectric layer and the first hard mask;
etching the first dielectric layer to form a first trench in the first dielectric layer and the second dielectric layer, wherein the first trench exposes the second conductive feature, wherein the etching is configured to have an etching selectivity between the first and second dielectric layers and the first hard mask, such that the etching etches away the first and second dielectric layers without removing the first hard mask;
forming a first plug in the first trench and on the second conductive feature;
removing the second dielectric layer;
forming a second hard mask on the first plug;
forming a third dielectric layer over: the first dielectric layer, the spacer, the first hard mask, and the second hard mask;
simultaneously etching a first opening and a second opening, wherein the first opening is etched to extend vertically through the third dielectric layer and the second hard mask to expose the first plug, and wherein the second opening is etched to extend vertically through the third dielectric layer and the first hard mask to expose the first conductive feature; and filling the first opening and the second opening with a conductive material, thereby forming a second plug in the first opening and a third plug in the second opening.

17. The method of claim 16, wherein the first conductive feature includes a gate stack.

18. The method of claim 17, wherein the second conductive feature includes a source/drain feature.

19. The method of claim 16, wherein the forming of the first trench uses an etchant composition selected to avoid substantial etching of the first hard mask.

20. The method of claim 16, wherein a top surface of the second hard mask is substantially coplanar with the top surface of the first hard mask.

* * * * *